(12) United States Patent
Kobayashi et al.

(10) Patent No.: US 6,320,916 B1
(45) Date of Patent: Nov. 20, 2001

(54) DIGITAL MAGNETIC RECORDING/REPRODUCING APPARATUS

(75) Inventors: Naoya Kobayashi, Odawara; Seiichi Mita, Kanagawa-ken; Masaharu Kondo, Odawara, all of (JP); Hideki Sawaguchi, San Diego, CA (US); Takashi Moriyasu, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/185,097

(22) Filed: Nov. 3, 1998

(30) Foreign Application Priority Data

Nov. 4, 1997 (JP) .................................................. 9-301766

(51) Int. Cl.[7] ...................................................... H03D 1/00
(52) U.S. Cl. ........................... 375/341; 375/262; 714/795
(58) Field of Search ..................... 714/795, 794; 375/262, 341, 263, 290

(56) References Cited

U.S. PATENT DOCUMENTS 5,822,340 * 10/1998 Stenstrom et al. .................... 714/795
6,046,874    4/2000 Takahashi .............................. 360/65

FOREIGN PATENT DOCUMENTS 8-293164   11/1996 (JP) .
9-213008    8/1997 (JP) .

OTHER PUBLICATIONS

Jiin Lee et al. "An Advanced Winchester Disk Controller" VLSI Technology, Systems and Apps, 1989. Proc. of Tech. Papers. 1989 Int Symposium. on, 1989, pp. 376–379.*

Yinyi Lin; Char-Yuan Yeh; "A Generalized Viterbi Algorithm for Detection of Partial Response Recording Systems", Magnetics, IEEE Transactions on, vol. 32 5 1, Sept. 1996, pp. 3983–3985.*

N. Seshadri et al., "List Viterbi Decoding Algorithms with Applications", *IEEE Transactions on Communications*, vol. 42, No. 2/3/4, Feb./Mar./Apr. 1994, pp. 313–323.

* cited by examiner

*Primary Examiner*—Stephen Chin
*Assistant Examiner*—Chieh M. Fan
(74) *Attorney, Agent, or Firm*—Antonelli, Terry, Stout & Kraus, LLP (57) ABSTRACT

A digital magnetic recording/reproducing apparatus that has an LVA detector, and that is able to maintain the coding rate as high as 8/9 or more, and record at a higher density than in the prior art, wherein, in order that the data sequences up to the $(2n-1)$th best sequence ($n>1$) are obtained in the order of higher likelihood ratios, and that. the candidates of those data sequences can be produced, the LVA detector has provided therein a unit which replaces the likelihood ratio and path memory of the ith best sequence by those of the $(2i-1)$th best sequence when the contents of the $(i-1)$th path memory coincide with those of the ith path memory ($i=2, 3, \ldots, n$) and the absolute value of the likelihood ratio difference between the $(i-1)$th best sequence and the $(2i-1)$th best sequence is smaller than a decision threshold, or a unit which initializes the likelihood ratio of the ith best sequence to be a constant difference value added to the likelihood ratio of the $(i-1)$th best sequence when the contents of the $(i-1)$th path memory and the ith $(i=2, 3, \ldots, n)$ path memory of the n candidates of data sequences are coincident.

11 Claims, 10 Drawing Sheets

(a) PATH MEMORY LENGTH≥CRC BLOCK LENGTH

(b) PATH MEMORY LENGTH<CRC BLOCK LENGTH

DIGITAL MAGNETIC RECORDING/REPRODUCING APPARATUS

BACKGROUND OF THE INVENTION

The present invention relates to digital magnetic recording/reproducing apparatuses such as magnetic disk recorders, and particularly to a signal processing system and apparatus for recording digital data at high density.

The demand for high-density recording and fast processing in magnetic disk recorders has more and more escalated. The signal processing techniques in the signal recording and reproducing system to support these requirements have also been developed towards the high-density and fast recording. As to the recording code, the coding rate R is increased, and now the main current is R=8/9. In addition, recently a higher rate recording code of R=16/17 has started to be practically used. Moreover, the partial response equalization system is employed in order to prevent the signal-to-noise ratio from being reduced by the increase of the intercode interference involved with the high-density recording. The PR4ML (Partial Response Class 4 with Maximum Likelihood Detection) is utilized to detect a signal sequence nearest to the reproduced signal by the Viterbi algorithm (best likelihood sequence estimation) using a known interference formed on the reproducing channel. A device for this purpose is already incorporated as an LSI (Large Scale Integrated Circuit) a magnetic disk product. It is known that if the input signal sequence to the PR4ML processor is binary data of 0, 1, the minimum squared Euclidean distance (MSED) between signal sequences produced by the PR4ML is 2. Therefore, the PR4ML is improved 3 dB in its tolerance to noise than the peak detection system (MSED=1) for deciding magnetic information by only 0, 1 without the best likelihood sequence estimation.

In order to achieve higher-density recording than the PR4ML, it is necessary to use such a signal processing technique as to increase the MSED. For this purpose, there are EPR4ML (Extended PR4ML), and EEPR4ML (Extended EPR4ML). These are the extensions of the PR4ML idea. The values of MSED for those extensions are known to be 4, 6 (binary conversion), respectively. In addition, the channel state number is 8 for EPR4ML, and 16 for EEPR4ML.

Figure 2:
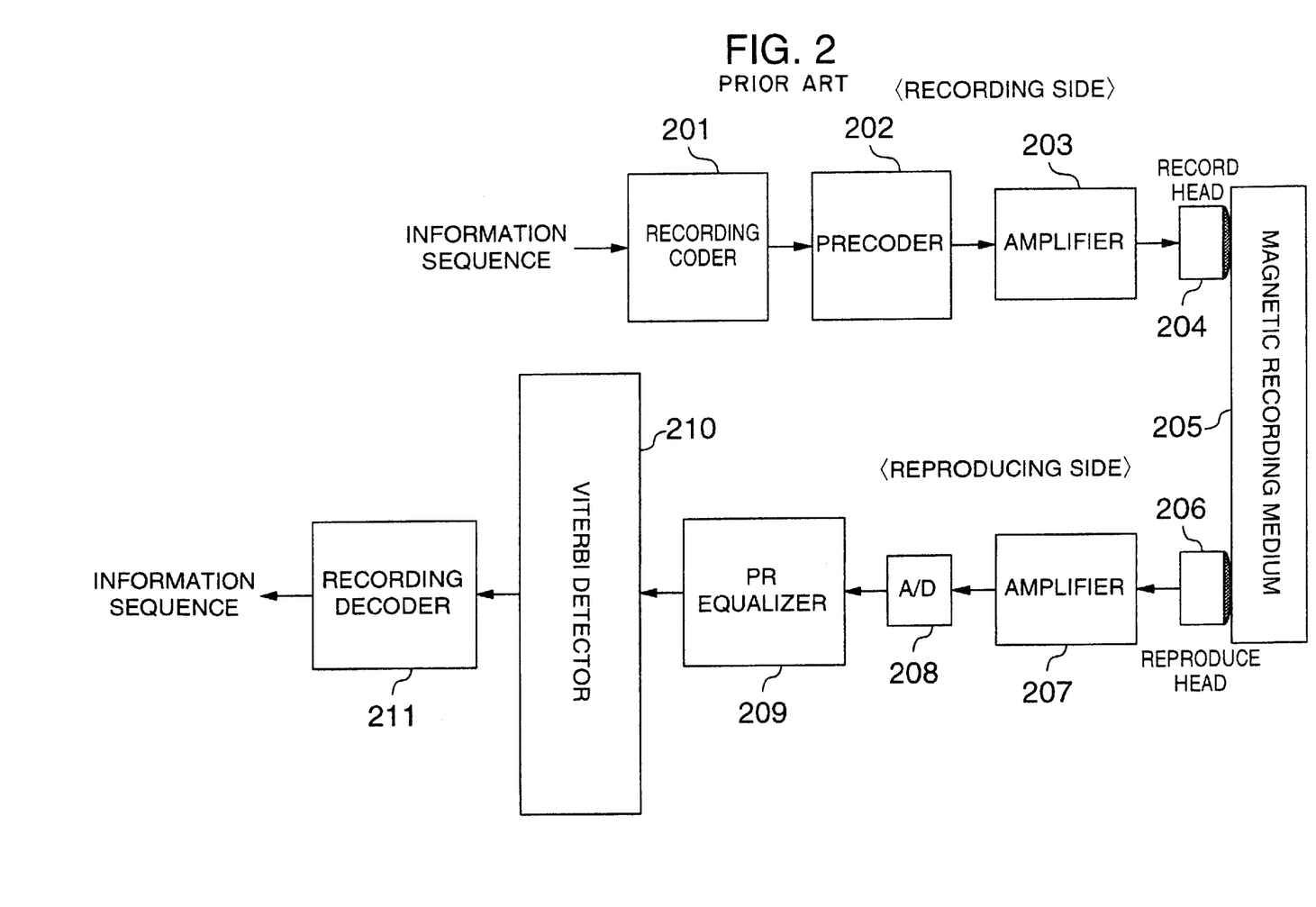
FIG. 2 is a block diagram of a conventional digital magnetic recording/reproducing apparatus.

FIG. 2 is a block diagram of a conventional digital magnetic recording/reproducing apparatus. As illustrated, on the recording side, an information sequence of "0"s and "1"s as digital data is converted into a high rate code such as R=8/9 or 16/17 by a recording coder 201. The recording code, as well known, has a limited number of successive "0"s provided to prevent the timing extraction and gain control (not shown in FIG. 2) in the reproducing section from being reduced in their performances. The recording coded sequence is further supplied to a precoder 202, thereby being converted into a code in which 1/(1+D) is treated as a transfer function. Only when data of "1" is supplied to the precoder 202, the output is changed from just the preceding value. Here, D is the delay operator, and the delay time is equal to the bit distance. The precoder 202 is able to suppress the decoded error propagation length after the Viterbi detection on the reproducing section to a limited value. The precoded sequence is supplied through an amplifier 203 to a record head 204, by which it is recorded on a magnetic recording medium 205 as magnetic information.

On the reproducing side, the magnetic information recorded on the magnetic recording medium 205 is reproduced by a reproduce head 206, and supplied to an amplifier 207, thereby being converted into an analog electric signal. This signal is supplied to an A/D converter 208, which samples it at each bit interval, thereby converting it into a digital signal. The digital signal is fed to a PR equalization circuit 209, which then equalizes it into partial response channels such as PR4, EPR4 and EEPR4. The PR equalization can be easily realized by a well known transversal filter. The output from the PR equalization circuit 209 contains noise added up to a signal level determined by the PR channel characteristic. Here, the noise contains the medium noise, the noise mixed from the reproduce-side head, and the noise caused by A/D quantization. These noises, when passed through the PR equalization circuit 209, become colored noises with a correlation. The equalized signal with the noise added is supplied to a Viterbi detector 210 that makes MLSE (Maximum Likelihood Sequence Estimation). Thus, it produces the most probable data sequence, or a data sequence most likely to resemble the input signal sequence. Since the reverse characteristic (1+D) to the precoder 202 can be produced as NRZI (Non Return to Zero Inverted) within the Viterbi detector as well known, a postcoder can be removed. The data sequence from the Viterbi detector 210 is decoded into the information sequence by a recording decoder 211.

Thus, this conventional digital magnetic recording/reproducing apparatus employs a high-rate recording code, and combines the partial response and Viterbi detection, thereby increasing the signal-to-noise ratio of the reproduced signal for high-density recording.

In recent years, other various signal processing systems for higher-density recording have been discussed in addition to the above-mentioned conventional apparatus. As a powerful one of those systems, there is a list Viterbi algorithm (hereinafter, referred to as LVA). In this system, the Viterbi detector 210 detects the most reliable data sequence (best sequence), secondly reliable data sequence (2nd best sequence), thirdly reliable data sequence (3rd best sequence), . . . , and nth reliable data sequence (nth best sequence), produces these as proposed sequences, or candidates, detects decoding error of each candidate by use of CRC (Cyclic Redundancy Check) or the like, and generates a decoded output of candidates with no decoding error. The LVA is able to greatly improve the decoding error characteristic of the Viterbi detector. The details of the LVA are described in N. Seshadri et al., "List Viterbi Decoding Algorithms with Applications", *IEEE Transactions on Communications*, Vol. 42, No. 2/3/4, Feb./Mar./Apr. 1994, pp. 313-323. The LVA was contrived for the purpose of originally applying to the communications field such as mobile radio communication, but it has not yet been applied to a magnetic recording/reproducing apparatus. The present invention fundamentally applies the LVA to a magnetic recording/reproducing apparatus as will be described in the later sections of embodiments. However, a simple application of the conventional idea directly to the apparatus cannot achieve high-density recording. This will be described in detail later.

Figure 3:
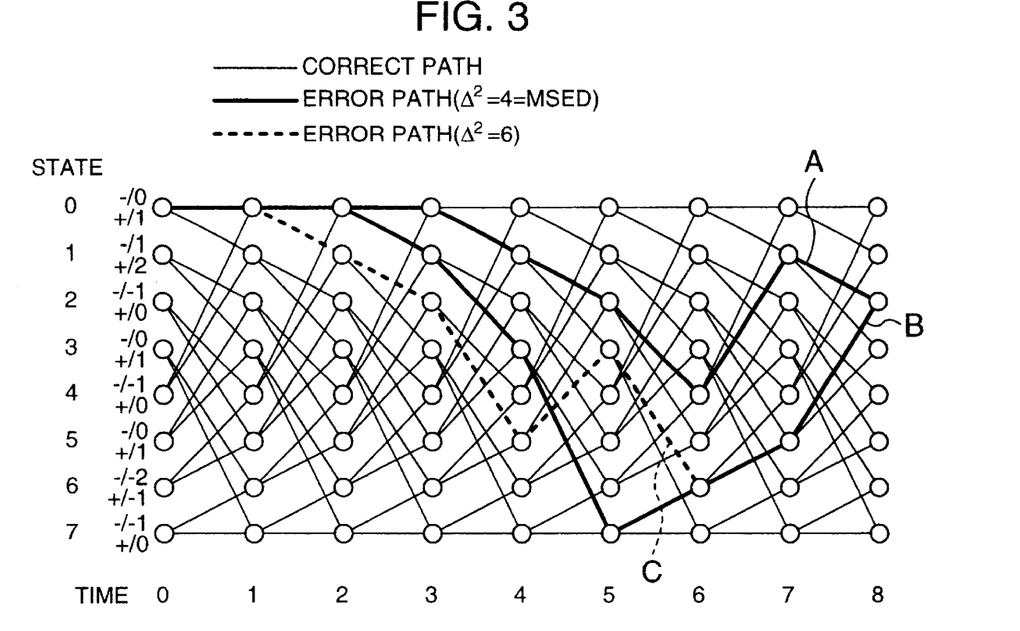
FIG. 3 is a trellis diagram of an EPR4 channel.

The basic idea of the LVA will be described as an example of EPR4 channel with reference to the trellis diagram of FIG. 3. FIG. 3 shows the structure of EPR4 channel with respect to time (here, time 0 to 8). The number of channel states is 8. The states 000, . . . , 111 are expressed as 0, . . . , 7, respectively. When −1 and +1 (which correspond to binary data 0, 1, respectively) are applied to the respective states, the associated PR equalization signals (expressed in binary conversion values as illustrated) are produced, making the channel states transitional.

It is now assumed that the state at time 0 is 1. When data 1 is applied at time 1, the PR equalization output of 2 is produced, and thus the channel state is shifted from 1 to 3.

The equalization signal of EPR4 channel takes five values of 2, 1, 0, −1, and −2. In FIG. 3, it is assumed that the line A indicates the state transition sequence (path) corresponding to the correct data sequence. However, as a result of the Viterbi detection, the decoded signal may sometimes be in error as indicated by line B. As will be seen from the figure, the squared Euclidean distance is 4 between the correct decoded path (the equalization signal value sequence is 0, 0, 0, 1, 1, −1, 0, 1) and the erroneous decoded path (the equalization signal value sequence is 0, 0, 1, 2, 1, −1, −1, 0). This is an error event of MSED=4. In general, the decoding error characteristic of the maximum likelihood sequence estimation is determined by MSED. The error event of MSED=4 occurs at the highest frequency in the EPR4ML.

On the other hand, the LVA estimates and produces a plurality of candidates (2nd best, 3rd best, . . . , nth best sequences) including the maximum likelihood estimated sequence (best sequence) in the order of higher probability (likelihood ratio). If there are two candidates, the path (correct sequence) indicated by the line A is produced as the best sequence, and the path (error sequence) indicated by the line B is produced as the 2nd best sequence as shown in FIG. 3. Since these candidates include the correct decoded path, the correct one can be selected by CRC error detection to both sequences. Therefore, the LVA can remove the error event of MSED=4, and a larger Euclidean distance error event will occur. In other words, the MSED is equivalently expanded, and thus the decoded error characteristic can be improved. In the case of EPR4ML, the MSED is expanded to 6 (an example of the error event of MSED=6 is indicated by line C). This means that the S/N (signal-to-noise ratio) of the reproduced signal is improved about 1.8 dB. Although an EPR4 channel has here been given as an example, the LVA can be applied to other PR channels than an EPR4 channel, and hence the decoded error characteristics can be improved.

The LVA is classified into serial system and parallel system as described in the above-given document. The serial system, at the time of the Viterbi detection, decides the 2nd best sequence if the best sequence becomes erroneous as the candidate, the 3rd best sequence if the 2nd best sequence is erroneous, and similarly the nth best sequence if the (n−1)th best sequence is erroneous. Thus, the LVA repeats the sequence estimation processing until there is no error. Of course, since n is practically definite, when error is still present after n repetitions, a signal indicating the presence of decoding error is transmitted to the transmission side, requesting to retransmit.

The parallel system, at: the time of Viterbi detection, produces n candidates at a time, and selects one with no error decided by CRC. In this case, too, when error is detected in all candidates, the signal indicating the presence of decoding error is transmitted to the transmission side, requesting to retransmit.

When the LVA is applied to a magnetic recording/reproducing apparatus, the serial system is able to achieve LVA detection by a relatively simple construction, but has too large maximum processing delay (n times as large as in the prior art) to be applied to fast processing. The parallel system needs a large amount of ACS (Add, Compare, Select) operations (n times as much as in the prior art) for estimating a proposed one, but can make fast processing since candidates can be produced in parallel. Therefore, the parallel system capable of fast processing is suited to the magnetic recording. The increase of the circuit scale causes practically no important problem since the process for LSIs (Large Scale Integrated Circuits) has recently fast developed.

Figure 4:
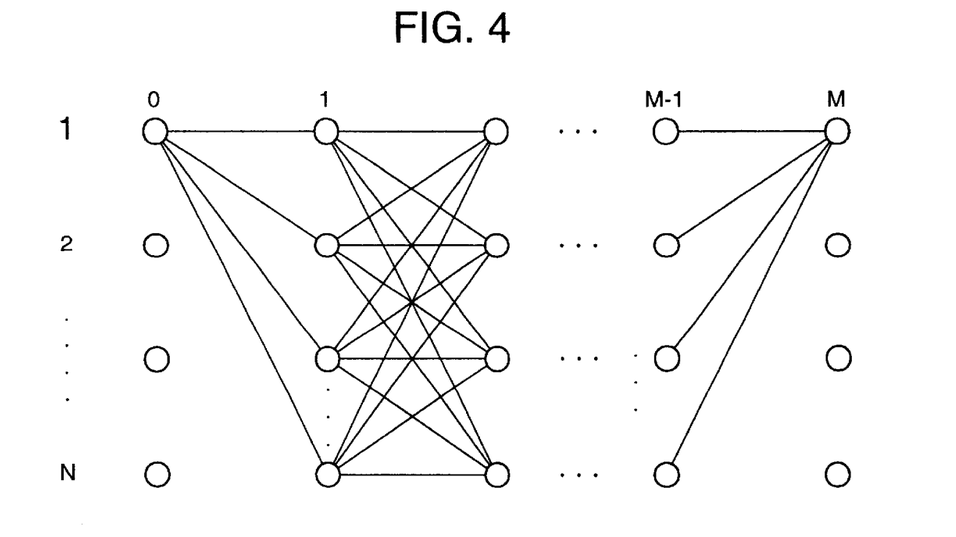
FIG. 4 is a trellis diagram of parallel LVA in the prior art.

According to the above document, the LVA of parallel system periodically fixes both of the starting and ending states to one (in the other cases than these states, N states) on the trellis diagram as shown in FIG. 4. On the starting side, the likelihood ratios of all candidates are reinitialized into the same value as the likelihood ratio of the best sequence. This is because the LVA needs to select n candidates having different likelihood ratios to be estimated within an interval of M bits, that is, always choose n different candidates of unlike likelihood ratios within this interval. Therefore, the n candidates to be detected at intervals of M bits each are all sure to be different.

Figure 5:
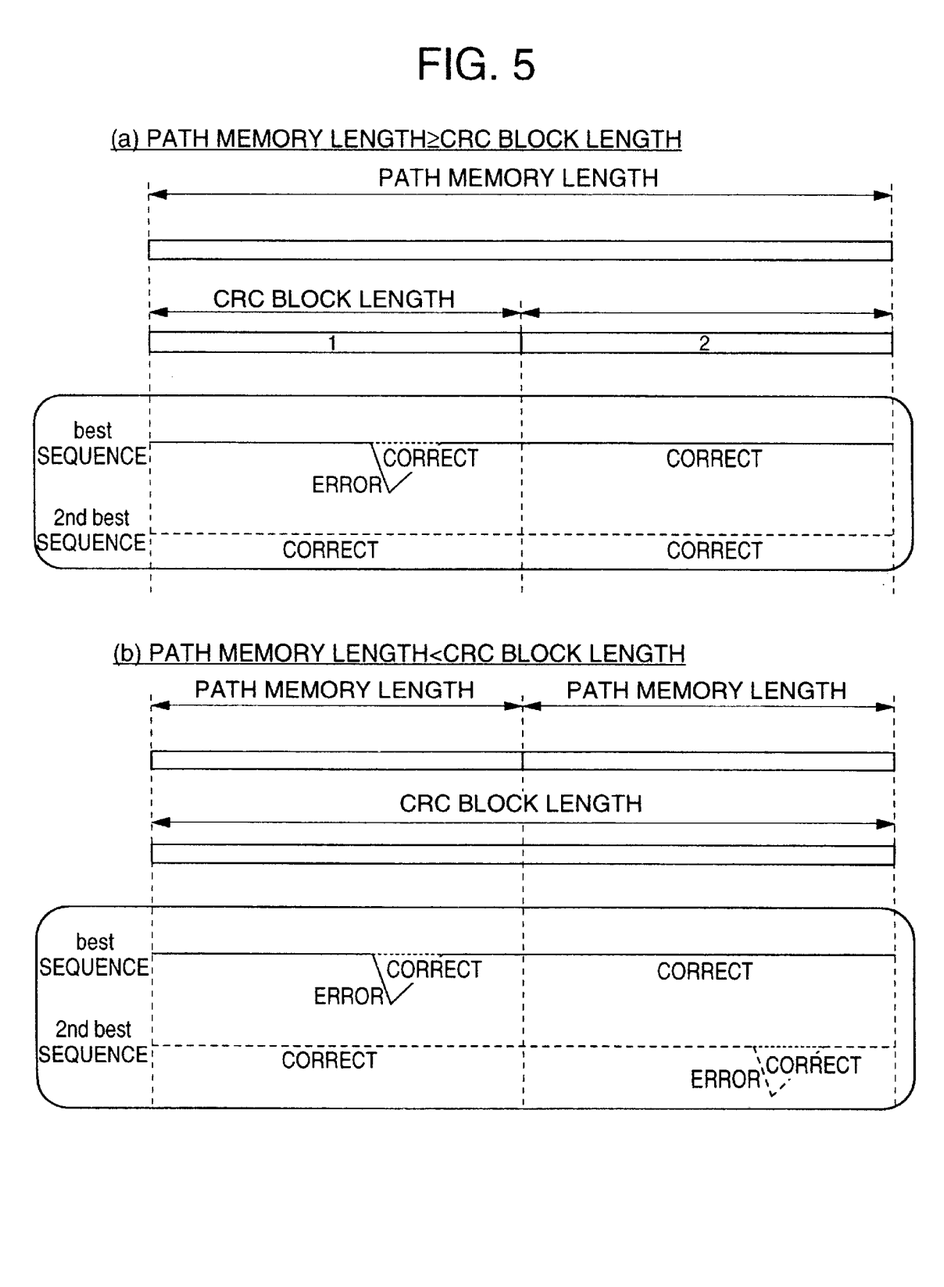
FIG. 5 is a diagram useful for explaining the problem caused by the relation between the LVA path memory length and CRC block length.

In this system, if the path memory length necessary for LVA detection is represented by K bits and the block length of CRC code by L bits, then the relation of K≧L must be satisfied, or the necessary path memory length is required to be set longer than or equal to the CRC block length. The reason for this will be mentioned with reference to FIG. 5. FIG. 5 shows the relations between the LVA path memory length and the CRC block length. The number of candidates is 2. Here, it is assumed that the S/N ratio is so high as to consider a probability that two or more error events will occur to be negligibly small. When the path memory length is larger than the CRC block length, the 2nd best sequence covers, even if an error event occurs in the first block of the best sequence, that error as shown in FIG. 5 at (a), that is, a correct sequence is included in the first or second block of either best or 2nd best sequence. However, when the path memory length is smaller than the CRC block length, errors can arise in both sequences over a CRC block length as shown in FIG. 5 at (b). This phenomenon in the prior art is caused because a different sequence is always selected for LVA at each path memory length. Thus, the LVA must consider the matching with CRC, and set the necessary path memory length to be more than the CRC block length.

When the LVA is applied to a magnetic recording/reproducing apparatus, the following problem is caused.

(1) Since the necessary path memory length for the LVA detector is required to be larger than the CRC block length, making the CRC block length long (more than about 100 bits) fails to construct the LVA detector. In the conventional system, the LVA is utilized in the communications field such as mobile radio communication, and thus it was not necessary to extremely increase the coding rate. Therefore, the CRC block length is as simple as at most 10 bits (the path memory length is about 20 bits), and the coding rate may be about 8/10. In practice, however, since the conventional system employs a combination of a convolution code of rate ½ as a code for constructing the trellis list in addition to the CRC code, the coding rate of the whole system is substantially as fairly low as 4/10. For the magnetic recording, the coding rate of the whole system is required to be more than 8/9 for high-density recording. Thus, the CRC block length for this purpose becomes very long (more than about 100 bits), and thus the LVA detector that needs a path memory length longer than that cannot be practically constructed since the processing delay becomes remarkably large.

(2) In the conventional system, each of the starting and ending state sides is periodically fixed to one state on the trellis list, and the likelihood ratios of all candidates on the starting state side are initialized to be the likelihood ratio of the best sequence. Thus, different candidates were always obtained at each path memory length. Therefore, the number of codes that can be assigned on the trellis is considerably limited, and thus the possible recording code rate is low (about ½) on the trellis. In other words, the conventional LVA cannot achieve more than the current rate 8/9.

Under the presence of the above problems, the conventional LVA cannot accomplish high-density recording.

SUMMARY OF THE INVENTION

In view of the above problems, it is an object of the invention to provide a digital magnetic recording/reproducing apparatus capable of maintaining the coding rate as high as more than 8/9, and making higher-density recording than in the prior art.

In order to solve the problems, according to the invention, the LVA detector has means provided which detects data sequences up to (2n−1)th (n>1) in the order of higher likelihood ratio, and which produces n candidates when the contents of the (i−1)th path memory coincide with those of the ith path memory (i=2, 3, . . . , n) and the absolute value of the difference between the (i−1)th and (2i−1)th likelihood ratios is smaller than a decision threshold by replacing the likelihood ratio and path memory for the ith best candidate by those for the (2i−1)th best candidate.

In addition, another means is provided which initializes so that the likelihood ratio of the (i−1)th best candidate with a constant difference value added thereto becomes the likelihood ratio of the ith best candidate, when the contents of the (i−1)th path memory and the ith path memory (i=2, 3, . . . , n) of the n candidates are equal to each other.

DESCRIPTION OF THE PREFERRED EMBODIMENTS

Figure 1:
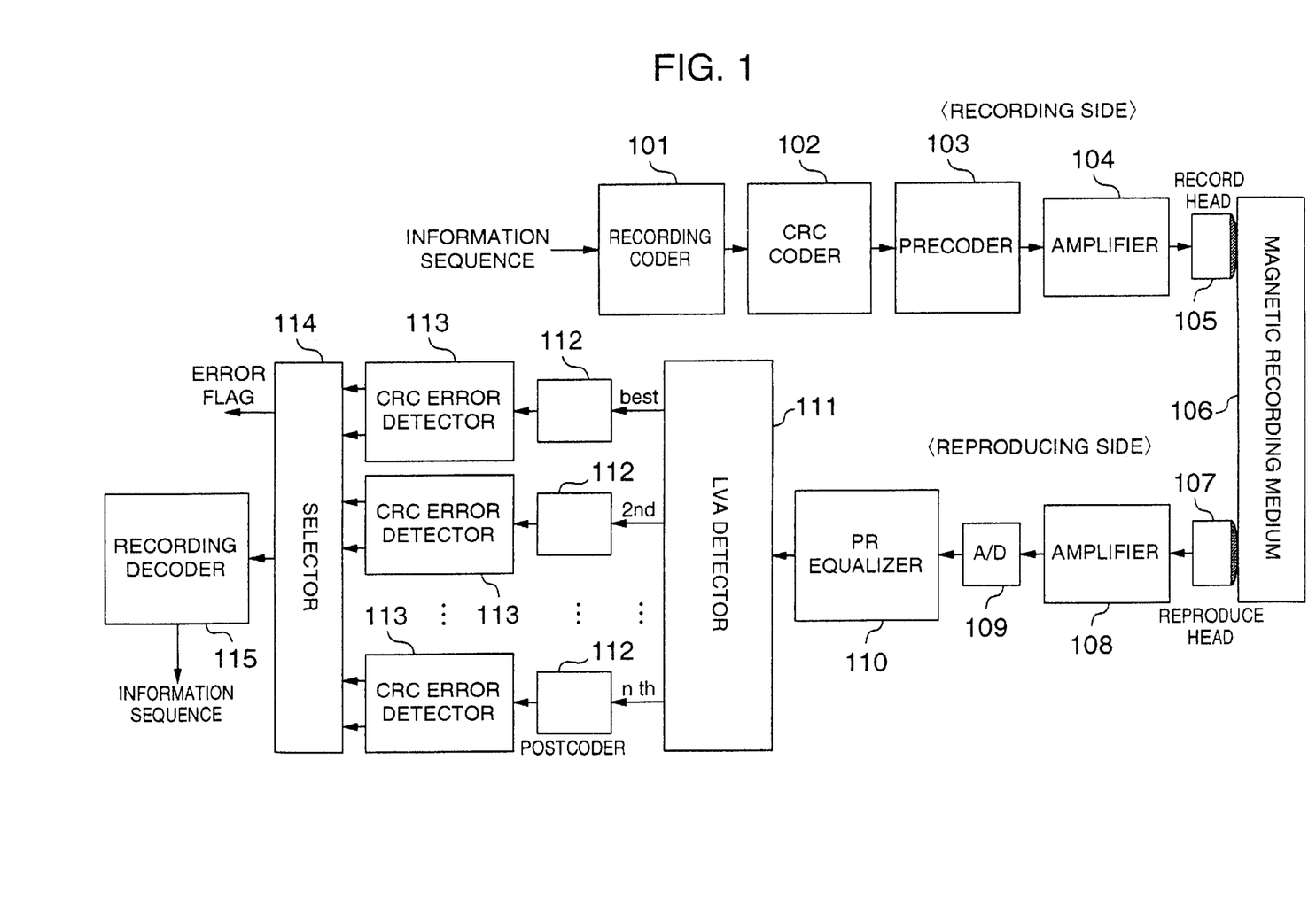
FIG. 1 is a block diagram of a digital magnetic recording/reproducing apparatus according to the invention.

Some embodiments of a digital magnetic recording/reproducing apparatus of the invention will be described with reference to the accompanying drawings. FIG. 1 shows the system structure of a digital magnetic recording/reproducing apparatus according to the invention. Referring to FIG. 1, on the recording side, a recording coder 101 converts an input information sequence of 0, 1 of digital data into a high rate code of $R=16/17$. The recording code, as well known, limits the number of successive 0s to a definite number, thereby preventing the timing extraction and gain control (not shown in FIG. 1) of the reproducing side from being reduced in their performances. The recording coded sequence is then coded for error detection by a CRC coder 102. The CRC can be achieved by the block code produced by adding error detection check bits to the recording coded sequence. Here, the coded sequence is constructed by blocks of much longer CRC block length (more than about 100 bits) so that the substantial coding rate after CRC coding becomes more than 8/9 for high-density recording. If, for example, CRC check bits of 8 bits are added to every 8 units each of which is composed of 17 bits after $16/17$ code conversion, the CRC block length is 8 units +8 bits, or 144 bits, and the coding rate becomes $128/144$, or 8/9 as a whole. Thus, the above CRC block structure is able to detect an arbitrary error of, for example, up to 2 bits. Error can be limited to 2 bits or below by the provision of a precoder 103. The precoder 103 converts the CRC coded sequence into a code using $1/(1+D^2)$ as a transfer function. Here, D is the delay operator that provides a delay time equal to the distance between bits. The precoder 103 and reproducing-side postcoders 112 can suppress the decoded error propagation length after Viterbi detection to a definite value. Therefore, the CRC can detect on the reproducing side all error patterns that have been limited to a definite length by the above means. The precoded sequence is supplied through an amplifier 104 to a record head 105 by which it is recorded as magnetic information on a magnetic recording medium 106.

On the reproducing side, the magnetic information recorded on the magnetic recording medium 106 is converted into an analog electric signal by a reproduce head 107 and amplifier 108. This analog signal is sampled at intervals of a bit, thereby being converted into a digital signal by an A/D converter 109. The digital signal is equalized into a partial response channel such as PR4, EPR4, or EEPR4 by a PR equalizing circuit 110. This PR equalization can be easily attained by the well known transversal filter. The output from the PR equalizing circuit 110 contains noise added to a signal level that is determined by the PR channel characteristic. Here, the noise added includes medium noise, mixed noise from the reproduce head, and A/D quantization noise. These noises, when passed through the PR equalizing circuit 110, become colored noises having a correlation. The equalized signal with noise added undergoes MLSE (Maximum Likelihood Sequence Estimation) in a LVA detector 111, which then produces n candidates including the most probable data sequence, or best candidate, in parallel (the arrangement of the LVA detector according to the invention will be described in detail later). The LVA detector according to the invention can be constructed by use of a shorter path memory length than the CRC block length by the technique mentioned in detail later. The n candidates from the LVA detector are reversely converted by the postcoders 112 using a transfer function of $1+D^2$ as opposed to the recording-side precoder 103. Then, the candidates after the postcoding are supplied to CRC error detectors 113, where errors are detected. The candidates produced from the CRC error detectors 113 are fed to a selector circuit 114 together with the associated syndromes. The selector circuit 114 selects one no-error decided sequence of syndrome 0 from the n input sequences or candidates, and supplies them to a recording decoder 115. At the same time, an error flag signal of 0 is also produced, and transmitted to a control circuit (not shown) to inform that there is no decoding error. This control circuit is a circuit to control the interface between the magnetic recording/reproducing apparatus and a computer. If none of the candidates has a syndrome of 0, it is decided that a decoding error has occurred, and an error flag signal of 1 is supplied to the control circuit, requesting to retransmit. The recording decoder 115 decodes the sequences, and restores the information sequence.

Figure 6:
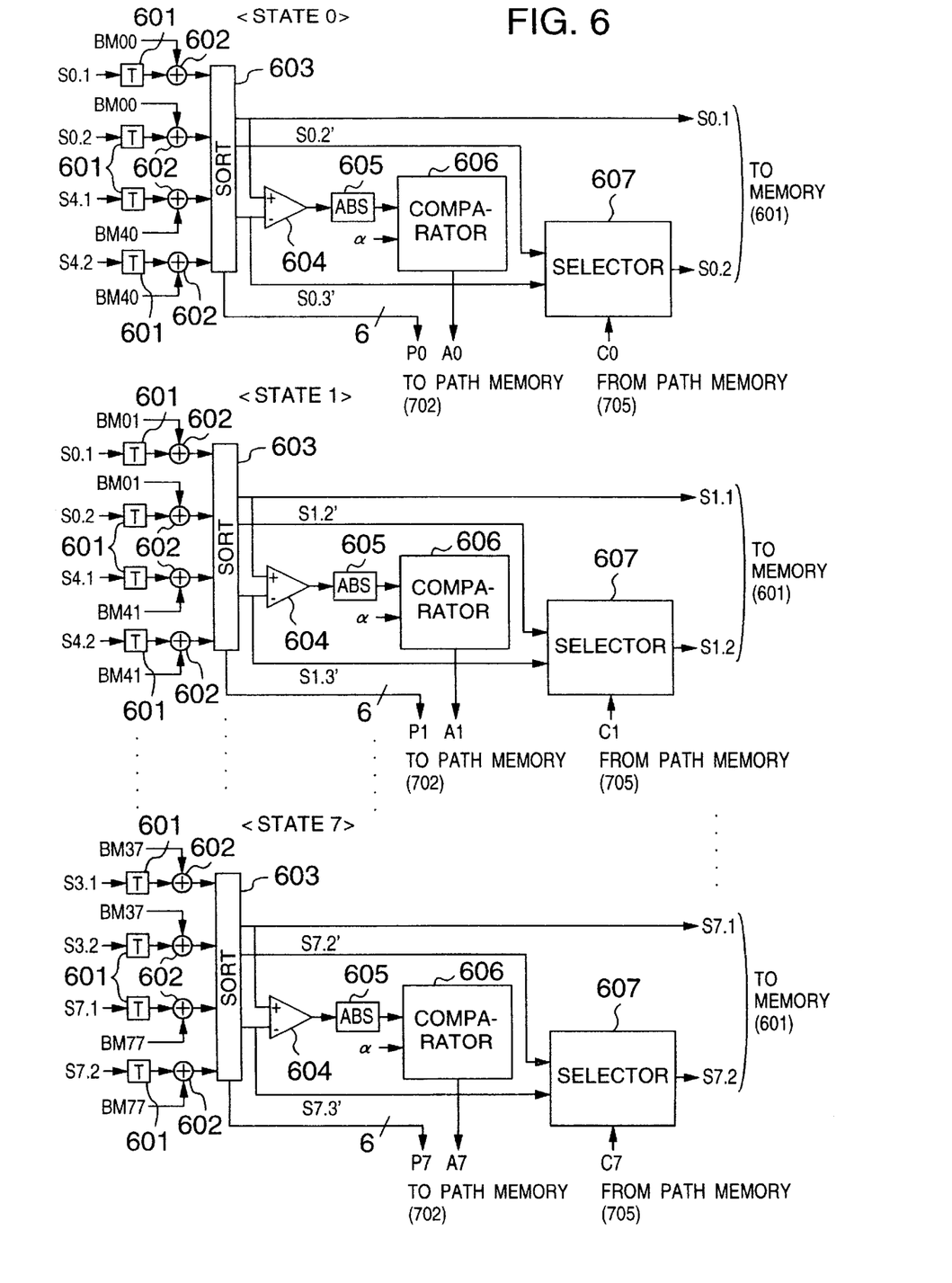
FIG. 6 is a block diagram of the construction of an ACS circuit of the LVA detector according to the first embodiment of the invention.
Figure 7:
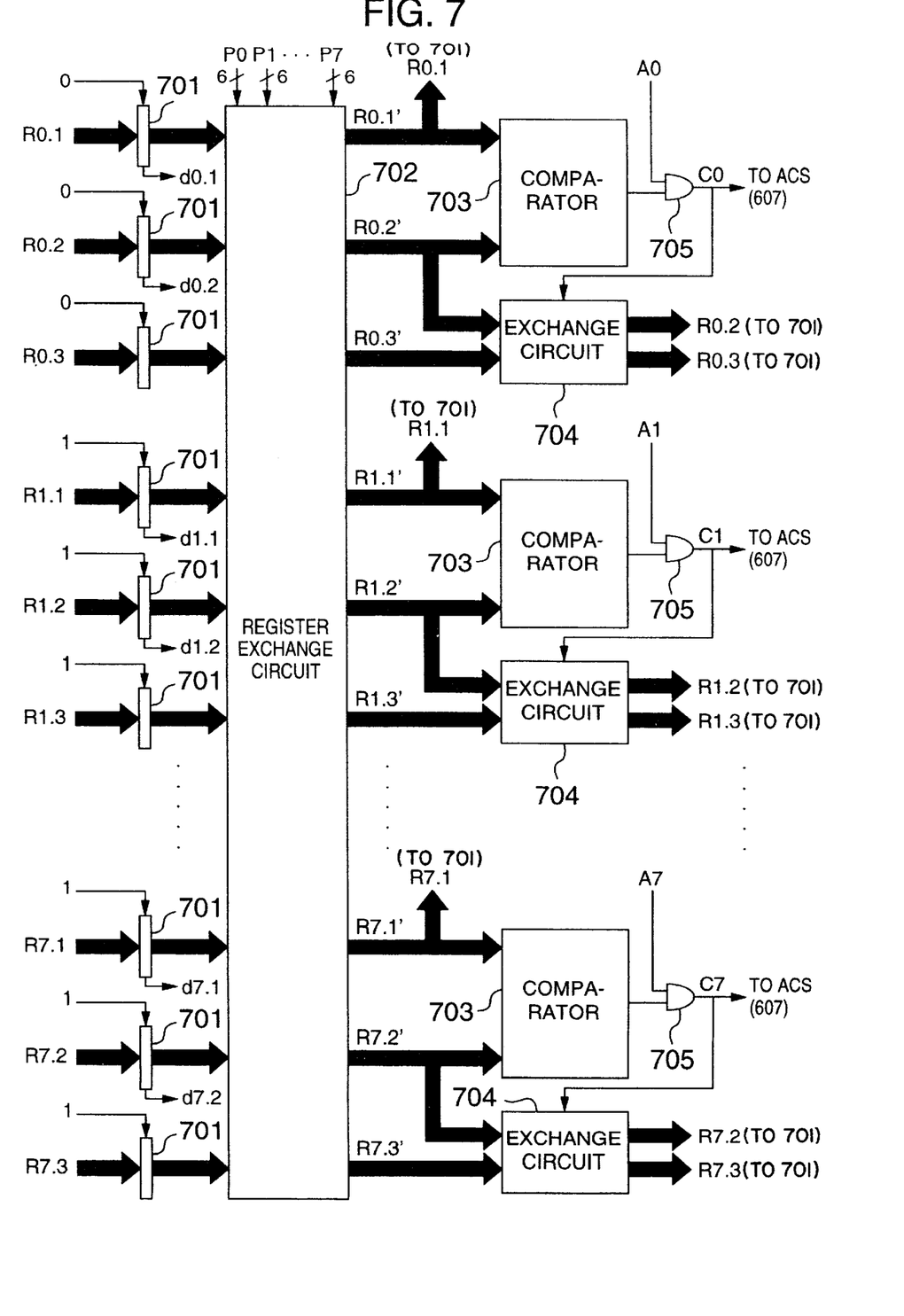
FIG. 7 is a block diagram of the construction of a path memory circuit of the LVA detector according to the first embodiment of the invention.

FIGS. 6 and 7 fully show the construction of the LVA detector 111 according to the first embodiment of the invention. FIGS. 6 and 7 respectively show the ACS circuit and path memory circuit in the LVA detector. Here, there are shown circuit arrangements for producing two candidates (the best and 2nd best sequences). The construction can be easily expanded to handle three or more candidates. In addition, although this embodiment illustrates an example of the circuit arrangements using an EPR4 channel, it is possible to similarly construct circuit arrangements using an arbitrary PR channel, for example, an EEPR4 channel. Referring to FIG. 6, the ACS operation makes parallel processing for every channel state $0, \ldots, 7$ (000, ..., 111). Here, the processing for state 0 will be mentioned as an example. The other states are quite similarly processed. For the state 0, there are provided four delay elements 601, which hold state likelihood ratios S0.1, S0.2, S4.1, S4.2 one sample time (D) before. Here, Sij indicates the likelihood ratio of the jth best sequence (j=1:best, 2:2nd) of state i (i=0, ..., 7). At the present time, when the PR equalized signal is applied, the squared distances of the differences to an ideal value (in the case of EPR4ML, 2, 1, 0, −1, −2) are calculated as branch likelihood ratios BMmn. Here, BMmn are the branch likelihood ratios of the transition paths from state m to state n (m, n:0, ..., 7) relative to the ideal values (see FIG. 3). Here, the circuit for computing the branch likelihood ratios Si.j is not shown. The likelihood ratios Si.j and the branch likelihood ratios BMmn are added by adders 602 according to the trellis diagram shown in FIG. 3. The results of the addition are fed to a sort circuit 603, which then selects the maximum, second and third high likelihood ratios, and produces them together with the corresponding path memory selecting signal P0. The P0 is a digital signal of 6 bits. The 6 bits are necessary because two bits are utilized to select each of the best, 2nd best and 3rd best sequences from the four input sequences to the sort circuit. The sort circuit 603 can be easily constructed by a comparator circuit or the like for comparing the input signals. In this embodiment, the sort circuit 603 selects up to the third likelihood ratio, which is used, if necessary, as a replacement for the second likelihood ratio as will be described later. The sort processing in this embodiment is unlike that in the prior art. It selects the same values if present. If, for example, the four input values are 5.3, 5.3, 3.2, and 1.7, the sort circuit produces at its output the values of 5.3, 5.3, and 3.2 as the best, 2nd best and 3rd best candidates, respectively. In the prior art, since different sequences are always selected, values of 5.3, 3.2, and 1.7 are chosen. The reason why the same values are included in this embodiment is that the LVA is designed to make by the path memory length shorter than the CRC block length. If the same values are selected, the associated path memories probably become the same (equal sequences). Therefore, in this case, it is necessary to decide if the same sequence as the best sequence may be treated as the 2nd best sequence, and to make the replacement relative to the 3rd best sequence.

The above processing and the circuit arrangement for this purpose will be described below. The basic idea is that in general when the contents of the (i−1)th path memory and ith memory (i=2, 3, ..., n) are coincident with each other in each state and the absolute value of the difference between the (i−1)th and (2i−1)th likelihood ratios is smaller than a decision threshold, the likelihood ratio and path memory for the ith best sequence are replaced by those for the (2i−1)th best sequence. In this embodiment, since n=2, when the contents of the first and second path memories coincide with each other and the absolute value of the difference between the first and third likelihood ratios is smaller than the threshold, the likelihood and path memory for the second best sequence are replaced by those for the third best sequence. The detailed construction of the path memory will be described separately with reference to FIG. 7. When the contents of the path memories of the best and 2nd best sequences are coincident with each other, and when the absolute value of the difference of the likelihood ratios of the best and 3rd best sequences is smaller than a decision threshold α, the above condition is satisfied. Thus, the ACS circuit (FIG. 6) receives a control signal C0=1 from the path memory circuit (FIG. 7), and supplies it to a selection circuit 607. When C0=0, the above condition is not satisfied. When C0=1, the selector circuit 607 produces the likelihood ratio of the 3rd best sequence, and treats it as the likelihood ratio S0.2 of the 2nd best sequence. When C0=0, the selector circuit 607 produces the likelihood ratio of the 2nd best sequence, and treats it as the likelihood ratio S0.2 of the 2nd best sequence (the replacement processing is not performed). The likelihood ratios S0.1 and S0.2 are again stored in the corresponding delay element 601 so as to be ready and waiting for the ACS operation at the next time. Here, the Si.j after sorting is fed back to the corresponding delay element 601 as Si.j as illustrated, but to avoid complexity, no connecting lines are shown.

In the path memory (see FIG. 7), when C0=1, the path memory for the 3rd best sequence and the path memory for the 2nd best sequence are replaced by each other. When C0=0, no replacement is carried out. It is possible to adequately select the 2nd best sequence by the above processing, and as will be described later, the LVA can be achieved by a shorter path memory length than the CRC block length.

For the comparison of likelihood ratios, as shown in FIG. 6, the difference value S0.1−S0.3 is calculated by a subtracter 604, and the absolute value of the difference is obtained by an absolute value circuit (ABS) 605. The absolute value is compared with the threshold α in a comparator circuit 606. When it is smaller than α, the control signal A0=1 is supplied to the path memory circuit. If it is not smaller than α, the control signal A0=0 is supplied to the path memory circuit. The threshold α is fixed to a half of MSED. For EPR4ML, α is 2. Although the above description is for the processing in the ACS circuit in the state 0, quite the same is applied to the other states.

FIG. 7 shows the arrangement of the path memory circuit. The path memory circuit makes register exchange processing by use of control signals P0, ..., P7 (of 6 bits each) produced from the ACS circuit (FIG. 6). Each of registers 701 has Ri.j written. Here, Ri.j is the contents of the path memory for the jth best (j=1:best, 2:2nd best, 3:3rd best) candidate in the state i (=0, ..., 7). Data of 0 or 1 is stored over K bits, where K is the path memory length. The registers 701 are shift registers, and are able to produce data in parallel. The control signals P0, ..., P7 produced from the ACS circuit are supplied to a register exchange circuit 702. The register exchange circuit 702 exchanges the path memories to be selected for each of best, 2nd best, and 3rd best sequences on the basis of the control signals P0, ..., P7. Each control signal is composed of 6 bits since two bits are required to select each of the best, 2nd best, and 3rd best sequences (see FIG. 6). The output signals after the exchange are supplied as Ri.j' to comparator circuits 703 and exchange circuits 704. The details for the state 0 will be described as an example. The other states are processed in the same way. The output signal R0.1' is fed to the comparator circuit 703 and fed back to the corresponding register 701 (to avoid complexity, the connecting lines for feedback to the registers are not shown). At the same time, the output signal R0.2' is supplied to the comparator circuit 703 and exchange circuit 704, and the output signal R0.3' is supplied to the exchange circuit 704. The comparator 703 compares the input signals R0.1' and R0.2'. If those signals are equal, the comparator produces 1. If they are not equal, the comparator produces 0. The output from the comparator 703 is fed to an AND gate 705 together with the control signal A0 from the ACS circuit. The AND gate 705 produces the logic product of both signals. The output C0 from the AND gate 705 is used as the control signal for the exchange circuit 704 and the selector circuit 607 in the ACS circuit. When C0=1, the exchange circuit 704 makes exchange processing for R0.2=R0.3', R0.3=R0.2', and at the same time the selector circuit 607 within the ACS circuit selects S0.3 (likelihood ratio of 3rd best sequence). When C0=0, no exchange processing is made. The output from the exchange circuit 704 is R0.2=R0.2', R0.3=R0.3', and the output from the selector circuit 607 within the ACS circuit is S0.2 (likelihood ratio of 2nd best sequence). The path memories R0.1, R0.2, R0.3 thus finally decided are fed back to the associated registers 701 (to avoid complexity, no connecting lines are shown).

The register 701 after the feedback operates as a shift register so that data 0 or 1 is serially inserted in the MSB (Most Significant Bit), and that data 0 or 1 is serially produced from the LSB3 (Least Significant Bit) as a result of decoding. In this case, the serially inputted data assumes an EPR4 channel. The even state (0, 2, 4, 6) is 0, and odd state (1, 3, 5, 7) is 1. The decoded outputs of best and 2nd best sequences state i are di.1 and di.2, respectively. The finally decoded result of the best sequence is decided by majority from di.1 (i=0, ..., 7), or d0.1 may be produced as a typical value. This is because when the path memory length is sufficiently long, the maximum likelihood decoded results in all states are fundamentally coincident. For the 2nd best sequence, similarly, the decoded result is decided by majority from di.2 (i=0, ..., 7) or d0.2 may be produced as a typical value.

According to this embodiment, the necessary path memory length of LVA can be reduced to ½ the CRC block length (halved as compared with the prior art).

Figure 10:
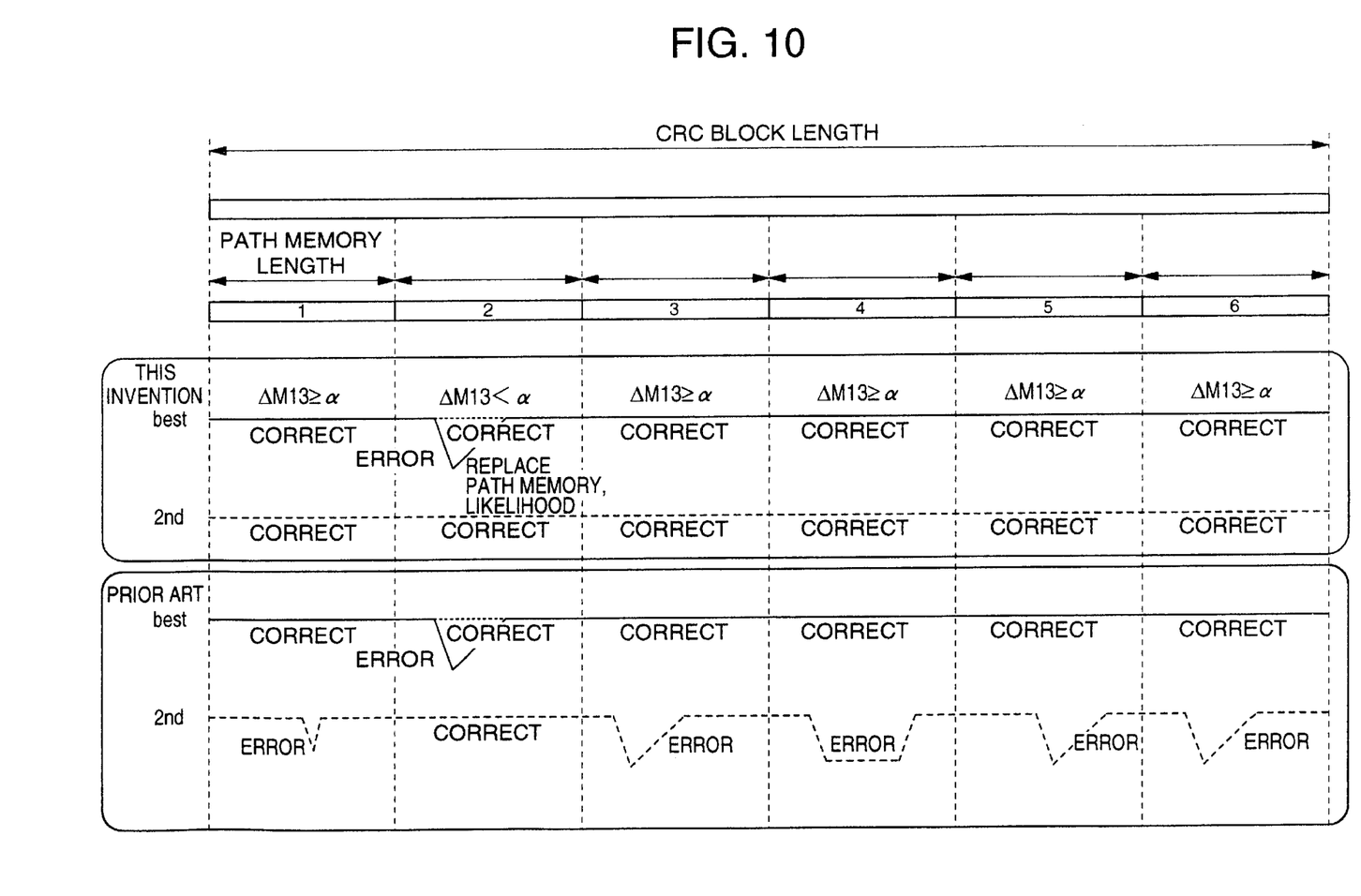
FIG. 10 is a diagram showing the path memory length reducing effect of the LVA detector according to the first embodiment of the invention.

FIG. 10 shows the effect of the path memory length reduction of LVA. In FIG. 10, the contents of the path memory for the best and 2nd best sequences are shown when the path memory length is, for example, ⅙ the CRC block length. If the CRC block length is 144 bits, the path memory length of LVA is 24 bits. Here, it is assumed that the S/N ratio in the input to the LVA detector is high enough so that a probability that an error event occurs twice or more over the CRC block length is negligibly small. In addition, it is assumed that time elapses in the order of memory block number (1, 2, ...) indicated at each memory. As illustrated, an error event occurs in the second memory block, but the decoding error of the best sequence is covered by the 2nd best sequence according to the invention. In the prior art, the best and 2nd best sequences always take different decoded outputs at each path memory length. Therefore, if the path memory length is shorter than the CRC block length, the candidates of both best and 2nd best sequences observed over the CRC block length are detected as erroneous sequences as illustrated. According to the invention, the same path memory (correct sequence) except the second memory block is selected for both best and 2nd best sequences. The likelihood ratios of the best sequence and 2nd best sequence are extremely close, but the absolute value of the likelihood ratio difference ΔM13 between the best sequence and the 3rd best sequence is larger than the threshold α. Thus, both best and 2nd sequences can be decided to be sufficiently reliable as compared with the 3rd best sequence. In the second memory block, an error event happens, and before making the replacement processing according to this embodiment, the same path memory (erroneous sequence) is selected for both best and 2nd best sequences (since the likelihood ratios of the best sequence and the 2nd best sequence are very close to each other). However, here, the absolute value of ΔM13 is smaller than α. This suggests that the candidate (correct sequence) considered as being reliable on a likelihood basis is present in the 3rd best sequence at a high probability. Thus, the likelihood ratio and path memory of the 2nd best sequence are replaced by those of the 3rd best sequence, and the candidate (3rd best sequence) different from the best sequence is selected as the 2nd best sequence. The above replacement processing makes it possible that a correct decoded sequence is included in either one of the best and 2nd best sequences of even the second memory block. As described above, only the true error event can be corrected and correct decoded outputs can be produced by use of the 2nd best sequence over the CRC block length.

Thus, according to this embodiment, when the path memories of the best and 2nd best sequences are equal, it is decided if the likelihood ratio of the 3rd best sequence is close to that of the best sequence by comparing the absolute value of the difference between them with the threshold α. If it is close, the 3rd best sequence is selected as the 2nd best sequence. If it is not close, the 2nd best sequence is selected as it is. This means that even when the best sequence and 2nd best sequence are equal, both candidates can be decided to be reliable as long as the likelihood difference relative to the 3rd best sequence is sufficiently large. In other words, in this embodiment, when the S/N ratio of the reproduced signal is high enough, the best and 2nd best sequences are fundamentally equal. Also, only when the reliability of the 3rd best sequence is high on a probability basis (the absolute value of the likelihood difference relative to the best sequence is smaller than the threshold), the 3rd best sequence (different from the best sequence in most cases) is selected as the 2nd best sequence, thus covering the decoding error. In the conventional system, the starting state and ending state in the trellis diagram were periodically fixed to one state, and the likelihood ratios of all candidates in the starting state were initialized to be the likelihood ratio of the best sequence so that a different candidate could always be obtained at each path memory length. Therefore, the possible coding rate was low, and the path memory length could not be made shorter than the CRC block length. According to the invention, since a different sequence is not necessarily selected as a candidate at each path memory length, all error phenomenon of any CRC (see FIG. 5 at (b) and FIG. 10) can Ad be prevented, and the path memory length can be made shorter than the CRC block length. In addition, since the likelihood ratios of candidates are equivalently initialized by the likelihood replacement mentioned in the embodiment section, there is no need to periodically fix the starting and ending states to one state in the trellis diagram and no need to initialize the likelihood ratios of all condidates in the starting state, thereby a high coding rate of ⅝ or above can be attained. The likelihood initialization (the above replacement processing) according to the invention resets by the replacement the likelihood ratio difference between the best and 2nd best sequences which difference is narrowed with time, thereby making it possible to objectively select candidates so that the same sequence as the best sequence cannot be unilaterally chosen as the 2nd best sequence. According to the invention, the likelihood initialization is performed not periodically as in the prior art, but it is made only as required, thereby realizing the high-rate coding and necessary path memory length reduction.

Figure 8:
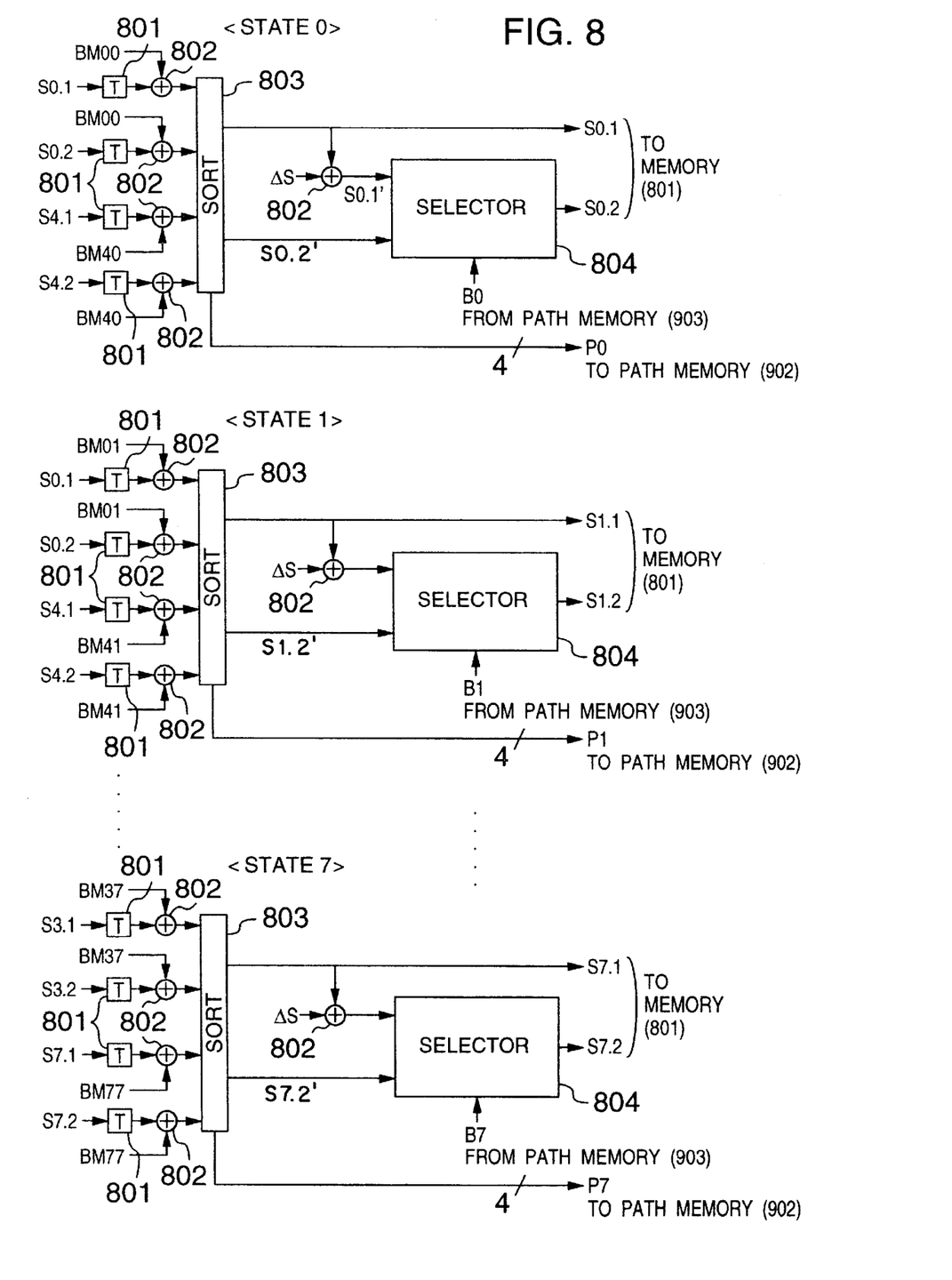
FIG. 8 is a block diagram of an ACS circuit of the LVA detector according to the second embodiment of the invention.
Figure 9:
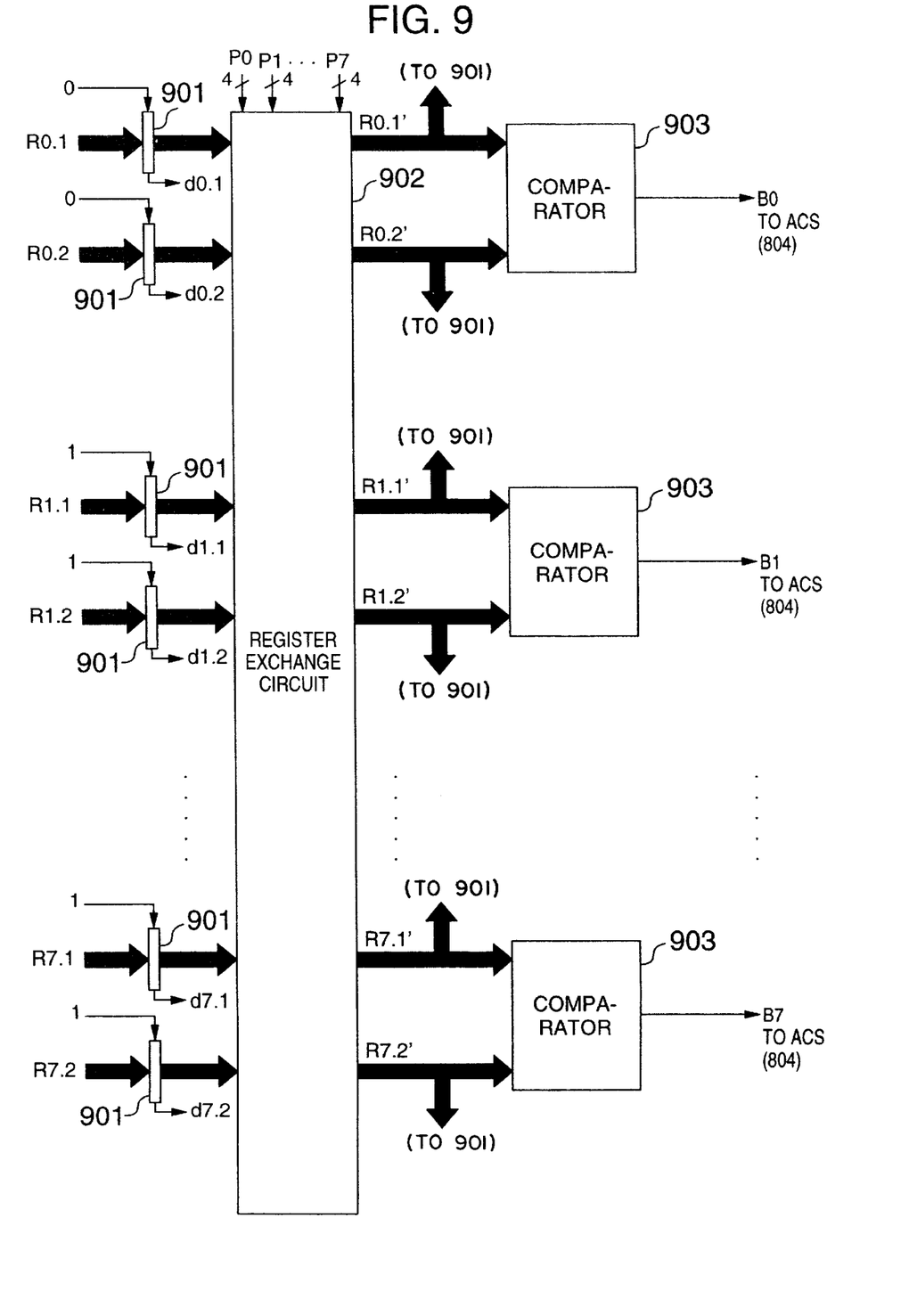
FIG. 9 is a block diagram of the construction of a path memory circuit of the LVA detector according to the second embodiment of the invention.

FIGS. 8 and 9 show detailed constructions of the LVA detector according to the second embodiment of the invention. FIGS. 8 and 9 respectively show block diagrams of the ACS circuit and path memory circuit in the LVA detector. Here, circuit arrangements are shown which produce two candidates (the best and 2nd best sequences). The circuit arrangements can be easily expanded to produce three or more candidates. In addition, although this embodiment is an example of using an EPR4 channel, it can be similarly modified for the arrangements using an arbitrary PR channel, for example, an EEPR4 channel. Referring to FIG. 8, the ACS operation is performed for channel states 0, ..., 7 (000, ..., 111 respectively) in parallel. Here, the processing for state 0 will be described as an example. The processing for other states can be made in quite the same way. In state 0, four delay elements 801 are provided to store state likelihood ratios S0.1, S0.2, S4.1, S4.2 one sample time (D) before. Here, Si.j is the likelihood ratio of the jth best candidate (j=1:best, 2:2nd best) in the state i (i=0, ..., 7). At the present time, when a PR equalizing signal is applied, the squared distance of the difference relative to the ideal value (2, 1, 0, −1, −2 for EPR4ML) is calculated as a branch likelihood ratio BMmn. Here, BMmn is the branch likelihood ratio to a PR equalizing ideal signal (see FIG. 3) of the transition path from state m to state n (m, n: 0, ..., 7). Also, the circuit for computing the branch likelihood ratio is not shown. The likelihood ratio Si.j and the branch likelihood ratio BMmn are added by adders 802 according to the trellis diagram shown in FIG. 3. The added results are fed to a sort circuit 803, which then selects the maximum likelihood ratio S0.1 and the second best likelihood ratio S0.2, and produces them together with the corresponding path memory selecting signal P0. Here, P0 is a digital signal of 4 bits, because two bits are necessary for each of the best and 2nd best sequences to be selected. The adder 802 adds the output S0.1 and a constant difference value ΔS to produce an output as a corrected value S0.1', which is then supplied to a selection circuit 804 together with S0.2. The difference value ΔS is fixed to the MSED value. In the case of EPR4ML, ΔS is equal to 4. The sort circuit 803 can be easily constructed by a comparator for comparing the magnitudes of the inputs. The sort processing in this embodiment is unlike that in the prior art. In other words, even if the same values are present, they are selected. If, for example, the four input values are 5.3, 5.3, 3.2, and 1.7, the sort circuit produces 5.3 and 5.3 as the best and 2nd best values at its output, respectively. In the prior art, since different sequences are always selected, the sort circuit chooses 5.3 and 3.2. In this embodiment, the same values are selected in order to realize LVA by use of a shorter path memory length than the CRC block length. If the same values are selected, the corresponding path memories probably become the same (the same sequence). Thus, in this embodiment, when the path memory for the best sequence is the same as that for the 2nd best sequence, the likelihood ratio of the best sequence is corrected and initialized to be the likelihood ratio of the 2nd best sequence. The likelihood initialization in this invention is performed so that the likelihood ratio difference between the best and 2nd best sequences, which difference is narrowed with time, is again established by the correction processing, and that the candidates are objectively selected without unilaterally choosing a sequence equal to the best sequence as the 2nd best sequence. According to the invention, only if necessary, the likelihood initialization is executed unlike the conventional system in which it was made periodically. Thus, the system according to the invention can attain the high-rate coding and necessary path memory length reduction.

The initialization processing and the circuit arrangement for making this processing will be described below. The basic idea is that in general when the contents of the (i−1)th path memory coincide with those of the ith (i=2, 3, ..., n) path memory in each state, the likelihood ratio of the (i−1)th best sequence is added with a constant difference value ΔS, and the sum is initialized to be the likelihood ratio for the ith best sequence. In this embodiment, since n=2, when the contents of the first and second path memories are coincident in each condition, the likelihood ratio of the first best sequence is added with the constant difference value ΔS, and the sum is initialized to be the likelihood ratio for the second best sequence. The detailed construction of the path memory will be separately described with reference to FIG. 9.

When the contents of the path memory for the best sequence are coincident with those for the 2nd best sequence, the above conditions are satisfied, and thus the ACS circuit receives the control signal B0=1 from the path memory circuit, and supplies it to the selection circuit. When B0=0, the above conditions are not satisfied. When B0=1, the selector circuit produces the corrected likelihood ratio S0.1' of the best sequence as the likelihood S0.2 of the 2nd best sequence. When B0=0, the selection circuit produces the likelihood ratio S0.2 of the 2nd best sequence as the Likelihood ratio S0.2 of the 2nd best sequence. The likelihood ratios S0.1 and S0.2 are again stored in the corresponding delay elements 801 to be ready and wait for the ACS operation at the next time. The Si.j after sorting is fed back to the corresponding delay element 801 as Si.j as illustrated, but the connecting lines are not shown to avoid complexity.

FIG. 9 shows the arrangement of the path memory circuit. In the path memory circuit, the control signals P0, ..., P7 (4 bits each) produced from the ACS circuit (FIG. 8) are used to make register exchange processing. Each of registers 901 has Ri.j written. Here, Ri.j is the contents of the path memory associated with the jth best (j=1:best, 2:2nd best) candidate in state i (=0, ...,7). Data 0 or 1 are stored over K bits. Here, K is the path memory length. The registers 901 are shift registers each capable of producing data in parallel. The control signals P0, ..., P7 produced from the ACS circuit are supplied to a register exchange circuit 902. The register exchange circuit 902 is responsive to the control signals P0, ..., P7 to exchange the path memories to be selected for each of the best and 2nd best sequences. Each control signal is composed of 4 bits because two bits are required to select each of the best and 2nd best sequences (see FIG. 8). The outputs after exchange are supplied as Ri.j' to comparator circuits 903, and also fed back to the corresponding registers 901 (the feedback connection lines are not shown to avoid complexity). The case of state 0 will be described in detail as an example. The other states can be similarly processed. The outputs R0.1' and R0.2' are supplied to the comparator circuit 903, and at the same time fed back to the corresponding registers 901. The comparator circuit 903 compares the R0.1' and R0.2'. If both input signals are equal, 1 is fed from the comparator to the ACS circuit as the control signal B0. If both input signals are not equal, 0 is similarly supplied as B0. When B0=1, the selection circuit 804 in the ACS circuit produces S0.1' (the corrected value of S0.1). When B0=0, the selection circuit 804 in the ACS circuit produces S0.2 (likelihood ratio of the 2nd best sequence).

The register after feedback operates as a shift register so that data 0 or 1 is serially inserted in the MSB (Most Significant Bit), and that data 0 or 1 is serially produced as a decoding result from the LSB (Least Significant Bit). Here, the serially inserted data assumes an EPR4 channel. The even state (0, 2, 4, 6) is 0, and the odd state (1, 3, 5, 7) is 1. The decoded outputs for the best and 2nd best sequences in state i (i=0, . . . , 7) are di.1 and di.2, respectively. The final decoded result for the best sequence is decided as di.1 by majority, but may be d0.1 as a typical value, because when the path memory length is long enough, the maximum likelihood decoded result in any state is fundamentally the same. The final decoded result for the 2nd best sequence is similarly decided as di.2 (i=0, . . . , 7) by majority, or may be d0.2 as a typical value.

According to this embodiment, the LVA necessary path memory length can be reduced to ½ the CRC block length (halved as compared with the prior art). Therefore, this embodiment is effective when the CRC block length is relatively short.

Figure 11:
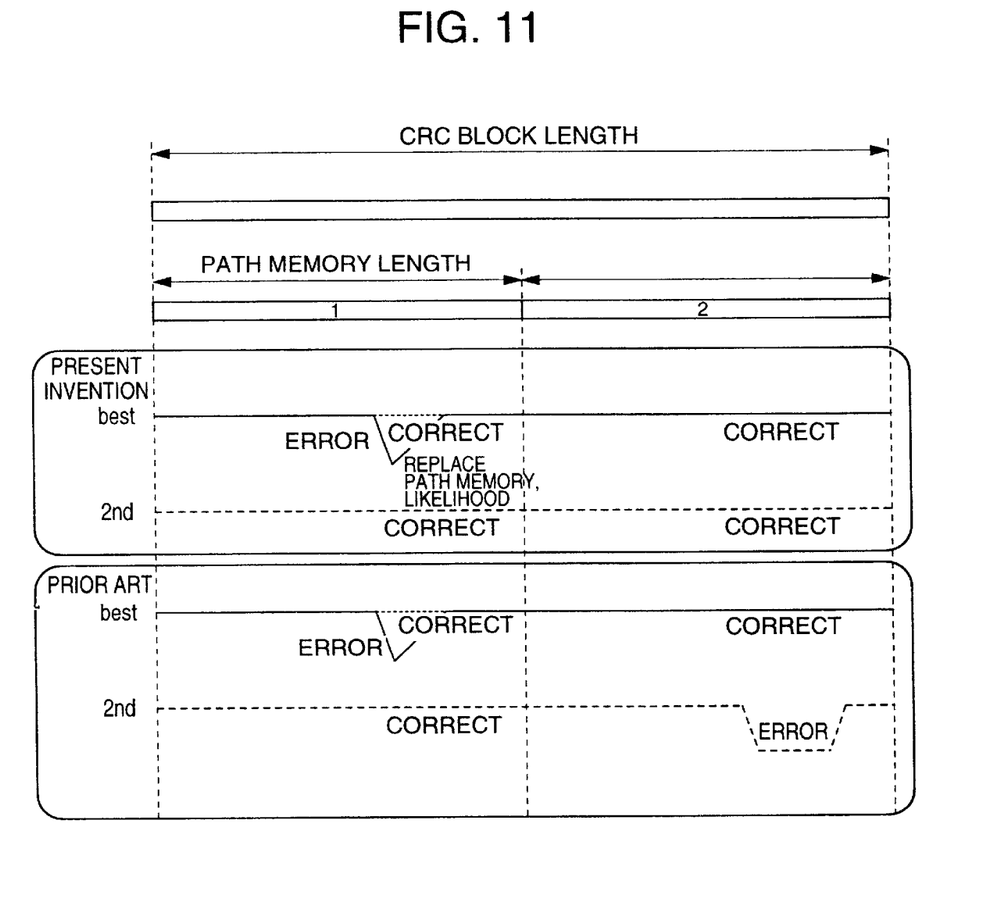
FIG. 11 is a diagram showing the path memory length reducing effect of the LVA detector according to the second embodiment of the invention.

FIG. 11 shows the effect of the path memory length reduction of LVA according to this embodiment. The contents of the path memories for the best and 2nd best sequences are shown in the case where the path memory length is ½ the CRC block length. If the CRC block length is 50 bits, the path bit memory length of LVA is 25 bits. Here, it is assumed that the S/N ratio in the input to the LVA detector is large enough to consider a probability that an error event occurs twice or more over the CRC block length to be negligibly small. In addition, it is assumed that time elapses in the order of memory block number (1, 2, . . . ) indicated at each path memory. As illustrated, an error event occurs in the first memory block, and the present invention covers the decoded error of the best sequence by use of the 2nd best sequence. In the prior art, different decoded outputs are always produced in the best and 2nd best sequences at each path memory length. Therefore, when the path memory length is shorter than the CRC block length, both best and 2nd candidates observed over the CRC block length will be detected as erroneous sequences. According to the invention, both best and 2nd best sequences select the same path memory (correct sequence) in the second memory block. Even when the likelihood ratios of the best sequence and 2nd best sequence are equal or very close, they are selected in the sort processing. In this invention, however, the likelihood ratio of the 2nd best sequence is, at this time, initialized by the compensation processing. Thus, in the third memory block (not shown), the best and 2nd best sequences select different path memories. By the above-mentioned compensation processing, it is possible to make a correct decoded sequence be included in either one of the best and 2nd best sequences. Thus, over the CRC block length, only true error events can be corrected, and thus correct decoded outputs can be obtained in the 2nd best sequence.

As described above, according to this embodiment, when the path memories of the best and 2nd best sequences are equal, the likelihood ratio of the best sequence is corrected and initialized to be the likelihood ratio of the 2nd sequence. In the prior art, the starting state and ending state in the trellis diagram were periodically fixed to one state, and the likelihood ratios of all candidates in the starting state were initialized to be the likelihood ratio of the best sequence. Thus, different candidates were always obtained at each path memory length. Accordingly, the possible coding rate was low, and the path memory length could not be made shorter than the CRC block length. According to the invention, since a different sequence is not necessarily proposed, or selected as a candidate at each path memory length, the phenomenon that the CRC becomes erroneous at all times (see FIG. 5 at (b) and FIG. 11) can be prevented, and the path memory length can be made shorter than the CRC block length. In addition, since the likelihood ratios of the candidates are equivalently initialized by the likelihood ratio correction processing as mentioned in the embodiment sections, there is no need to periodically fix the starting state and ending state in the trellis diagram to one state and initialize the likelihood ratios of all condidates in the starting state. Thus, a higher coding rate than in the prior art can be attained. The likelihood initialization according to the invention is to again set by the correction the likelihood ratio difference between the best and 2nd best sequences, which difference is narrowed with time, and to objectively select the candidates so as not to unilaterally select a sequence equal to the best sequence as the 2nd best sequence. According to the invention, since the likelihood ratio initialization is performed only if necessary, not periodically as in the conventional system, higher rate coding and the reduction of necessary path memory length can be achieved.

The embodiments of the invention as described above are easily expandable even when three or more candidates are used in LVA. In addition these embodiments can be applied to an arbitrary channel for example, an EEPR4 channel.

Thus, according to the invention, the necessary path memory length of the LVA detector can be reduced to less than half the CRC block length, and the LVA structure can be made simpler than in the prior art. In addition, since the likelihood difference between candidates can be initialized with the starting and ending states in the trellis diagram being not periodically fixed to one state, the coding rate can be increased to a higher value of ⅚ or more.

The present invention can be easily expanded so that three or more candidates can be used in LVA, and also applied to an arbitrary PR channel, for example, an EEPR4 channel. Therefore, the invention can provide a digital magnetic recording/reproducing apparatus having a simple construction and being capable of high-density recording.

What is claimed is:

1. A digital magnetic recording/reproducing apparatus for recording and reproducing digital information comprising:
   a Viterbi decoder which decodes a signal sequence obtained by partial response equalization, and produces n candidates of best data, second best data, third best data, . . . nth best data; and
   a selection circuit which detects error in each of the data sequences, and selects/produces sequences with no error as correct decoded results;
   wherein the Viterbi decoder includes an adder which adds error detection check bits at each constant period of the data sequences so as to examine if the digital information is correctly decoded; and wherein the Viterbi decoder produces the n candidates of data sequences such that the n candidates of data sequences have a shorter path memory length than the error detection check bits.

2. A digital magnetic recording/reproducing apparatus according to claim 1, wherein in order that the data sequences up to the (2n−1)th best sequence (n>1) are obtained in the order of higher likelihood ratios, and that the n candidates of those data sequences can be produced, the Viterbi decoder includes a unit which replaces the likelihood ratio and the path memory of the ith best candidate by those of the (2i−1)th best candidate when the contents of the (i-th) path memory coincide with those of the ith path memory (i=2, 3, . . . n) and the absolute value of the likelihood ratio difference between the (i−1)th best candidate and the (2i−1)th best candidate is smaller than a decision threshold.

3. A digital magnetic recording/reproducing apparatus according to claim 1, wherein the Viterbi decoder includes a unit which initializes the likelihood ratio of the ith best candidate to be a constant difference value added to the likelihood ratio of the (i−1)th best candidate when the contents of the (i−1)th path memory and the ith path memory (i=2, 3, . . . n) of the n candidates of data sequences are coincident.

4. A digital magnetic recording/reproducing apparatus for recording and reproducing digital information comprising:
a magnetic recording medium which records precoded information, the precoded information being divided into CRC error detection blocks, each of the CRC detection blocks including coded data and error detection check bits added to the coded data;
a reproduce head and an amplifier which cooperate to convert the precoded information recorded in the magnetic recording medium into an analog signal;
an A/D converter which converts the analog signal into a digital signal;
an equalizing circuit which equalizes the digital signal to produce an equalized digital signal;
an LVA (List Viterbi Algorithm) detector which produces n candidates of a data sequence from the equalized digital signal using a path memory having a length which is shorter than a length of each of the CRC error detection blocks;
postcoders which reversely convert, with respect to precoding performed to obtain the precoded information recorded in the magnetic recording medium, the n candidates produced by the LVA detector to produce n postcoded candidates;
CRC (Cyclic Redundancy Check) error detectors which detect errors in the n postcoded candidates; and
a selector circuit which selects a postcoded candidate having no errors detected by the CRC error detectors from the n postcoded candidates.

5. A digital magnetic recording/reproducing apparatus according to claim 4, wherein the equalization circuit equalizes the digital signal into a partial response channel selected from PR4 (Partial Response Class 4), EPR4 (Extended PR4), and EEPR4 (Extended EPR4).

6. A digital magnetic recording/reproducing apparatus according to claim 4, wherein the LVA detector produces the n candidates by using MLSE (Maximum Likelihood Sequence Estimation).

7. A digital magnetic recording/reproducing apparatus according to claim 4, wherein the n candidates are a best candidate to an nth best candidate; and
wherein to enable the best candidate up to a (2n−1)th best candidate of the n candidates (n>1) to be produced in an order of higher likelihood ratio, the LVA decoder includes a unit which replaces a likelihood ratio and a path memory of an ith best candidate of the n candidates (i=2 to n) by a likelihood ratio and a path memory of a (2i−1)th best candidate of the n candidates when (1) contents of an (i−1)th path memory are equal to contents of an ith path memory and (2) an absolute value of a difference between a likelihood ratio of a (i−1)th best candidate of the n candidates and the likelihood ratio of the (2i−1)th best candidate is smaller than a decision threshold.

8. A digital magnetic recording/reproducing apparatus according to claim 4, wherein the LVA decoder includes a unit which initializes a likelihood ratio of an ith best candidate of the n candidates (i=2 to n) to be a sum of (1) a likelihood ratio of an (i−1)th best candidate of the n candidates and (2) a constant difference value when contents of a (i−1)th path memory are equal to contents of an ith path memory.

9. A digital magnetic recording/reproducing apparatus for recording and reproducing digital information comprising:
a Viterbi decoder which decodes a signal sequence obtained by partial response equalization and produces n candidates of a decoded result, the n candidates being a best candidate to an nth best candidate, each of the n candidates being divided into error detection blocks obtained by adding error detection check bits to a data sequence at constant intervals; and
a selection circuit which detects errors in the n candidates based on the error detection blocks, and selects a sequence having no detected errors from the n sequences as a correct decoded result;
wherein the Viterbi decoder produces the n candidates using a path memory having a length which is shorter than a length of each of the error detection blocks.

10. A digital magnetic recording/reproducing apparatus according to claim 9, wherein to enable the best candidate up to a (2n−1)th best candidate of the n candidates (n>1) to be produced in an order of higher likelihood ratio, the Viterbi decoder includes a unit which replaces a likelihood ratio and a path memory of an ith best candidate of the n candidates (i=2 to n) by a likelihood ratio and a path memory of a (2i−1)th best candidate of the n candidates when (1) contents of an (i−th) path memory are equal to contents of an ith path memory and (2) an absolute value of a difference between a likelihood ratio of an (i−1)th best candidate of the n candidates and the likelihood ratio of the (2i−1)th best candidate is smaller than a decision threshold.

11. A digital magnetic recording/reproducing apparatus according to claim 9, wherein the Viterbi decoder includes a unit which initializes a likelihood ratio of an ith best candidate of the n candidates (i=2 to n) to be a sum of (1) a likelihood ratio of an (i−1)th best candidate of the n candidates and (2) a constant difference when contents of an (i−1)th path memory are equal to contents of an ith path memory.

* * * * *